United States Patent [19]

Robinson et al.

[11] Patent Number: 5,589,042

[45] Date of Patent: Dec. 31, 1996

[54] SYSTEM AND METHOD FOR FABRICATION OF PRECISION OPTICAL RAMP FILTERS

[75] Inventors: Klaus Robinson, Woodland Hills; Hugh L. Garvin, Malibu, both of Calif.

[73] Assignee: Hughes Aircraft Company, Los Angeles, Calif.

[21] Appl. No.: 336,592

[22] Filed: Nov. 8, 1994

[51] Int. Cl.$^6$ .................................................. C23C 14/34
[52] U.S. Cl. ................ 204/192.34; 204/192.26; 204/192.27; 204/192.3; 427/162; 427/164; 216/24
[58] Field of Search ................ 204/192.26, 192.27, 204/192.28, 192.3, 192.32, 192.34, 192.35, 298.31, 298.36; 216/24; 427/162, 164, 165

[56] References Cited

U.S. PATENT DOCUMENTS

| | | | |
|---|---|---|---|
| 4,359,373 | 11/1982 | Hammer | 204/192.34 |
| 4,456,515 | 6/1984 | Krueger et al. | 204/192.27 |
| 4,457,803 | 7/1984 | Takigawa | 204/192.34 X |
| 4,465,551 | 8/1984 | Horwitz | 216/24 |
| 4690555 | 9/1987 | Ellerbroek | 356/121 |
| 4,727,000 | 2/1988 | Ovshinsky et al. | 204/192.27 X |
| 4,888,201 | 12/1989 | Veenvliet et al. | 216/24 X |
| 4,901,667 | 2/1990 | Suzuki et al. | 204/298.36 X |
| 5,035,787 | 7/1991 | Parker et al. | 204/298.36 X |

OTHER PUBLICATIONS

Reynard Enterprises, Inc. ™ "Linear Variable Neutral Density Fitre" Commercial brochure, pp. 1–2.

OCLI, "Selectraband™ Linear Variable Filters" Comercial brochure, pp. 1–2.

Hass, George, Ed. and Thun, Rudolf E, "Physics of Thin Films—Advances in Research and Development", (1966) Academic Press, vol. 3, New York and London, pp. 47—47.

Brien, B. O. and Russell, T. A. "Program of Sessions for Contributed Papers" (1934) J. Opt. Soc. Am., 24, 54.

Chopra, Thin Film Phenomena, McGraw–Hill, New York (1969), pp. 10, 11, 21 and 35.

*Primary Examiner*—Nam Nguyen
*Attorney, Agent, or Firm*—V. D. Duraiswamy; W. K. Denson-Low

[57] ABSTRACT

A system and method for fabricating optical ramp filters utilizes an ion beam sputter etching system and a shaped aperture mask to produce optical ramp filters with precise control over the transmission and reflectance properties of the filter. The ion beam is passed through a shaped aperture whose width varies as a function of its length. The resultant shaped ion beam is used to etch a uniform reflective layer that was previously deposited on a transparent substrate. The substrate and the reflective layer are translated relative to the shaped aperture so that the shaped ion beam "travels" across the reflective layer. Different parts of the reflective layer are exposed to the ion beam for different amounts of time as a result of the varying width of the shaped ion beam. The result is a reflective layer with a nonuniform depth profile (a ramp filter). The method allows control of the layer thickness with a precision of less than 0.5 nm. This precision exceeds that achieved with prior fabrication methods that control the thickness of the layer during the deposition (or growth) stage.

8 Claims, 3 Drawing Sheets

SYSTEM AND METHOD FOR FABRICATION OF PRECISION OPTICAL RAMP FILTERS

BACKGROUND OF THE INVENTION

1. Field of the Invention

The present invention relates to optical ramp filters. More specifically, the present invention relates to a system and method of fabricating high resolution optical ramp filters.

2. Description of the Related Art

Certain optical analytical systems require filter components, such as optical ramp filters, that provide precise values of optical transmission and reflectance that vary as a function of position on the filter. A detailed description of such a system is given in copending commonly assigned U.S. patent application Ser. No. 08/045,841, now U.S. Pat. No. 5,350,917 filed on Apr. 9, 1993, entitled "Wavefront Error Estimation Derived From Observation Of Arbitrary Unknown Extended Scenes".

In typical optical ramp filters, a thin layer reflective material, such as silver or gold, is deposited on a window that is optically transparent at the filter's operating wavelength. The thickness of the reflective layer is varied as a function of position on the window.

When light (at the filter design wavelength) is directed at the filter, a portion of this light is reflected by the reflective layer and a portion is transmitted through the reflective layer and the window. As the reflective layer thickness increases, there is a corresponding increase in the percentage of light that is reflected from the reflective layer. If the reflective layer exhibits no absorption and if it is formed on an ideal window that exhibits no absorption, the percentage of light transmitted (T) and the percentage of light reflected (R) are related by the expression: $1=T+R$. Thus, as the percentage of light reflected increases, there is a corresponding decrease in the percentage of light transmitted.

Prior methods and systems for fabricating optical ramp filters vary the thickness of the reflective layer at the time that it is being deposited on the window. The reflective layer is typically deposited using well known evaporation or sputtering techniques, such as those explained in Kasturi L. Chopra, *Thin Film Phenomena*, McGraw-Hill, New York (1969), pages 10, 11, 21 and 35. One of the problems with these standard deposition techniques is the existence of "clustering" during the early stages of the deposition process.

As the metal is deposited onto the window, the metal deposits form separate isolated islands or clusters. When the layer begins to approach 4 to 8 nm in thickness, the separate metal clusters begin to merge. When the layer reaches 4 to 8 nm in thickness, the clusters completely merge to form a smooth metal layer.

As a result of this clustering effect, the resolution or control that can be achieved with respect to film thickness variation is limited. This results in less control and lower resolution with respect to the transmission and reflectance variation of the optical ramp filter. Since the clustering effect remains until the film is at least 4–8 nm thick, it is not possible to make very thin films (for example, films with a thickness that varies from 0 to 10 nm) or to vary the film thickness by less than 8 nm reliably. With evaporation or sputtering techniques, film thickness variations are typically 10 to 100 nm.

SUMMARY OF THE INVENTION

In view of the limitations of prior optical ramp filter fabrication methods, the object of the present invention is to provide a system and method for fabricating optical ramp filters that allow finer and more precise control over film thickness variations than prior fabrication methods.

These improvements are achieved by the use of an ion beam sputter etching system and a shaped aperture to precisely and controllably etch a thin metal film to produce the desired variation in its optical transmission and reflectance. A combination of variable etching and uniform etching is used to provide the precise film thicknesses desired.

The ion beam is passed through a shaped aperture and the film is translated underneath the aperture. Since the aperture is shaped (its width varies along its length), different parts of the film are exposed to the etching beam for different amounts of time as the film is translated underneath the aperture. This varying exposure time causes a ramp to form in the film.

The metal film is translated underneath the aperture a number of times until the desired thickness variation (ramp slope) is achieved. If one desires a film that varies from zero thickness to some predetermined maximum thickness, the film is passed underneath the aperture until the desired ramp slope is achieved and then a uniform ion beam (a uniform beam passed through a uniform aperture or with no aperture) is used to etch the film until the thinnest part of the ramp is etched down to the bare substrate. The uniform etching beam preserves the ramp slope that was achieved with the varying aperture.

Because ion beam sputter etching is an atom-by-atom process that can be controlled precisely by varying the amount of time the metal film is exposed to the beam, very slight variations in etch rates (and consequently in metal film depths) can be achieved with slight variations in the opening of the aperture. As a result, the present system and method is more predictable and controllable than prior optical ramp filter manufacturing methods that vary the thickness of the film during the deposition stage.

With the present system and method, optical ramp filters can be manufactured with shallower ramp slopes than prior ramp filters. In addition, ramp filters with ramps that are less than 10 nm thick can be manufactured.

These and other features and advantages of the invention will be apparent to those skilled in the art from the following detailed description of preferred embodiments, taken together with the accompanying drawings, in which:

DETAILED DESCRIPTION OF THE INVENTION

Figure 1:
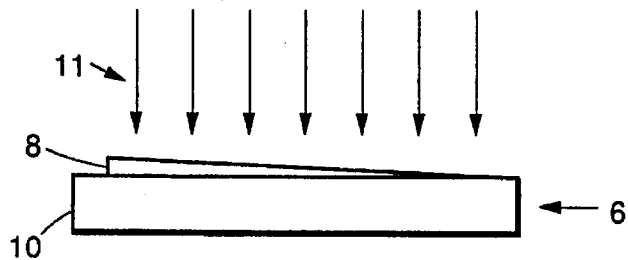
FIG. 1 is a sectional view showing a typical ramp filter.

FIG. 1 shows a typical optical ramp filter 6. A thin layer of metal 8, such as silver or gold, is deposited on a substrate 10 that is optically transparent at the filter's operating wavelength. The thickness of the metal layer 8 is varied as a function of position on the substrate 10. The optical transmission and reflectance properties of the metal layer 8 vary as a function of its thickness, therefore, different parts of an optical beam 11 incident on the filter 6 will experience different transmission and reflection coefficients.

Prior methods and systems for fabricating optical ramp filters vary the thickness of the metal layer 8 at the time it is being deposited on the substrate 10. The metal layer 8 is typically deposited using well known evaporation or sputtering techniques. One of the problems with these standard deposition techniques is the existence of "clustering" during the early stages of the deposition process.

Figure 2A:
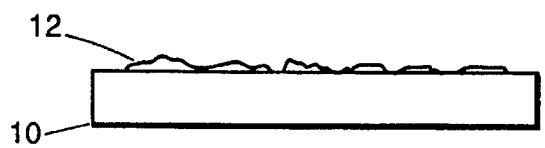
FIGS. 2a, 2b and 2c are sectional views illustrating a prior method of fabricating ramp filters.
Figure 2B:
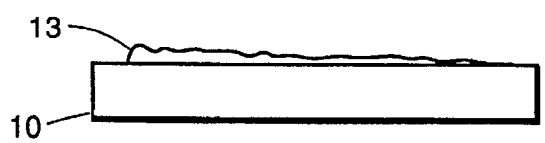
Figure 2C:
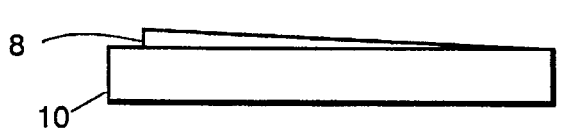

FIG. 2 illustrates the clustering effect during layer deposition. As the metal is deposited onto the substrate 10, the metal deposits form separate isolated islands or clusters 12 as shown in FIG. 2a. When the layer begins to approach 4 to 8 nm in thickness, the separate clusters begin to merge as shown by the ragged metal profile 13 in FIG. 2b. When the layer reaches 4 to 8 nm in thickness, the clusters completely merge to form the smooth metal layer 8 as shown in FIG. 2c. This clustering effect limits the thinness of the metal layer 8 (the layer cannot be less than 4 to 8 nm thick). Therefore, filters with metal layers of less than 4 to 8 nm thick or with very shallow ramp slopes (the slope of the metal layer) cannot be reliably and predictably fabricated using these prior methods.

The present invention takes a different approach to the fabrication of optical ramp filters then the prior fabrication techniques described above. Instead of initially forming a reflective layer with the desired ramp profile, a reflective layer of a predetermined thickness is first laid down and then an ion beam is used to etch away portions of the uniform layer until the desired profile is achieved.

Figure 3:
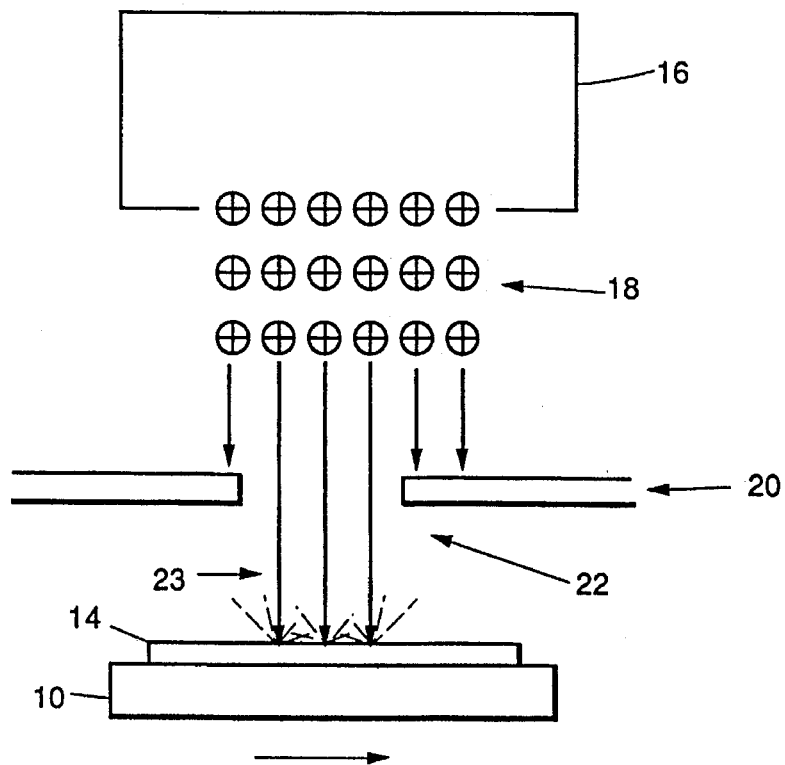
FIG. 3 is a sectional view illustrating the general concept of using an ion beam source and a shaped aperture to fabricate optical ramp filters.
Figure 4A:
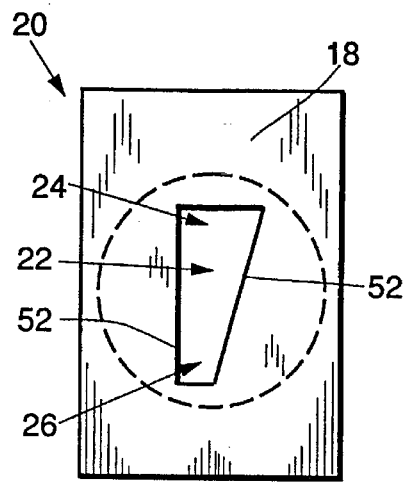
FIG. 4a is an enlarged plan view of an aperture mask with a linear variation in the aperture width as a function its length.
Figure 4B:
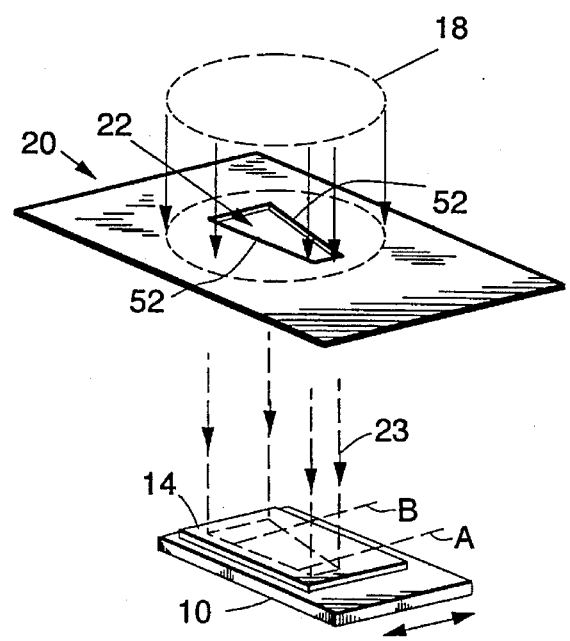
FIG. 4b is a perspective view illustrating the function of the aperture mask.

FIGS. 3, 4a and 4b illustrate the basic concept of the invention. A metal layer 14 is deposited on a transparent substrate 10 using one of the well known deposition techniques (evaporation or sputtering). An ion beam source 16 produces a beam of accelerated ions 18. The ion beam 18 is passed through an aperture mask 20 with a shaped opening 22. FIGS. 4a and 4b illustrate the aperture mask, which is typically made of metal, and its function in more detail. The opening 22 is shaped such that its width varies as a function of its length. The ion beam 18 passes through the mask opening 22 and acquires its shape, with the mask 20 blocking the portion of the beam outside the opening 22.

The shaped ion beam 23 then strikes the metal layer 14 and etches away the metal layer. The substrate 10 and metal layer 14 are translated underneath the aperture. The sections of the metal layer that pass underneath the wider part of the ion beam are exposed for a longer time than those sections that pass underneath the narrower part of the ion beam. This results in different amounts of material being etched away as the substrate and metal layer are translated underneath the mask 20, with more material being etched from the sections of the metal layer being exposed to the wider part of the ion beam. Multiple translations (passes) are carried out until the desired ramp slope is achieved.

Figure 4C:
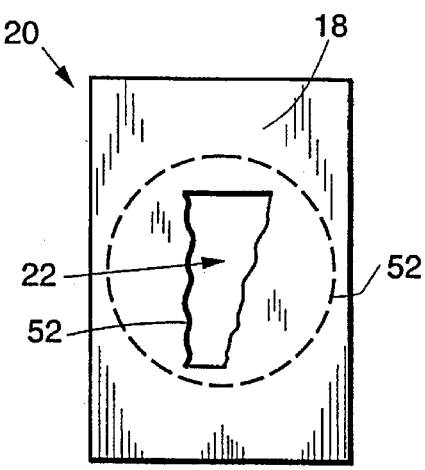
FIG. 4c is an enlarged plan view of an aperture mask with a non-linear variation in the aperture width as a function its length.

The aperture mask shown in FIGS. 4a and 4b produce a linear variation in etch rates because the edges 52 of the opening 22 are straight. However, as shown in FIG. 4c, the edges 52 can be shaped to produce any desired nonlinear variation in the etch rate.

The metal layer 8 that is initially deposited is preferably of uniform thickness, however, a non-uniform metal layer can be laid down with a corresponding adjustment to the shape of the aperture mask to compensate for the nonuniformity of the metal layer.

To better illustrate the process, one can consider a film of metal 14 whose thickness needs to vary from 0 to 15 nm over a length of 3 mm on the surface of a transparent substrate 10. The metal 14 is deposited uniformly to a thickness of 200 nm on the substrate A metal aperture mask 20 is made with a linear variance in the opening 22 such that a single pass of the substrate underneath the mask 20 etches 5.0 nm of metal off the part of the layer 14 that is underneath the narrow part 26 of the opening 22 (position "A" on the metal layer 14) and 5.5 nm off the part of the layer 14 that is underneath the wide part 24 of the opening 22 (position "B" on the metal layer 14). The opening is made 3 mm in length (from the widest part of the opening to the narrowest part).

After ten passes the "A" position will be etched 50 nm and the "B" position will be etched 55 nm. Thus, a 5 nm variation in layer 14 thickness is produced between positions "A" and "B". After twenty passes, a 10 nm variation results and the layer 14 will have been etched down 150 nm at the "A" position and 165 nm at the "B" position.

Once this thickness variation is established, a uniform etching beam 18 is used to etch the deepest part of the ramp (the "B" position) down to the bare substrate. This leaves a precise ramp of metal, similar to 8 on FIG. 1, that varies from 0 to 15 nm over a length of 3 mm.

Figure 5:
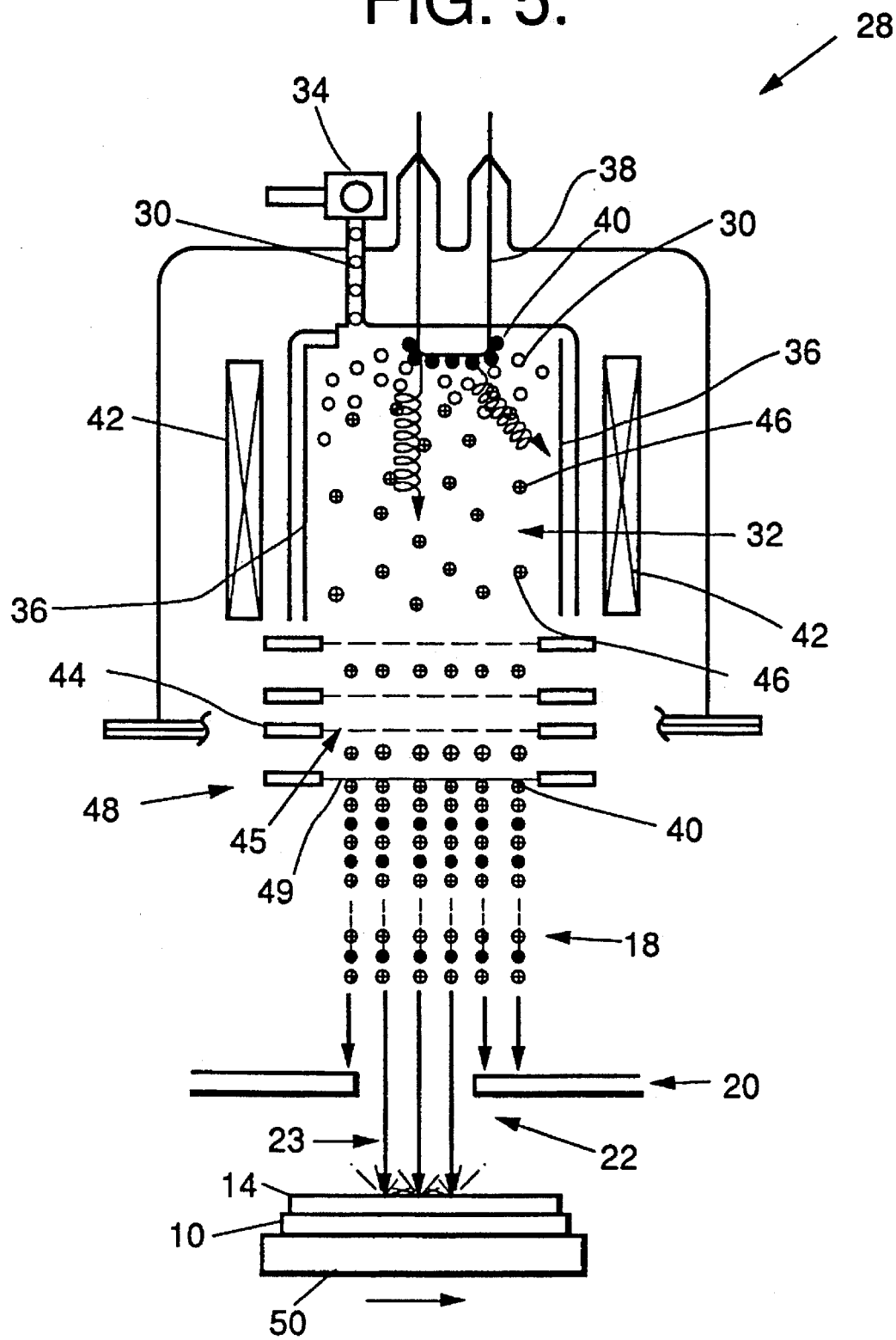
FIG. 5 is a sectional view of a preferred embodiment for the filter fabrication system.

FIG. 5 illustrates a detailed implementation of the preferred embodiment. An ion beam sputtering system 28 is used as the ion beam etching source. Ion beam sputtering systems are well known in the art. An inert gas, such as Argon 30, is pumped into a cylindrical chamber 32 through a valve 34. The sides of the chamber 32 are formed from metal and act as anodes 36. A potential is applied between the anodes 36 and a cathode 38, typically between 40 to 50 volts. Electrons 40 are repelled from the cathode 38 towards the anodes 36. A cylindrically shaped magnet 42 applies a magnetic field that causes the electrons 40 to spiral as they are accelerated towards the anodes 36. The spiraling motion induced by the magnet 42 increases the probability that an electron 40 will collide with an argon atom 30 and strip away an electron 40 from the argon atom 30.

Once an electron 40 is stripped from an argon atom 30, the argon atom 30 is ionized (it is positively charged). Metal grids 44 (a thin sheet of metal with holes 45 in it) are placed at a negative electric potential with respect to the cathode 38, typically between 500 and 1,000 volts. These metal grids 44 attract the argon ions 46, which pass through the holes in the grids as a result of the momentum they accumulate as they accelerate towards the grids 44 (the individual ions 46 are typically accelerated to an energy of approximately 500 electron-volts). A neutralizer 48 introduces enough electrons 40 into the ion beam 18 so that the net charge in any given part of the beam 18 is zero. The neutralizer 48 is typically made from tungsten wire 49. An electrical current is passed through the wire 49, which heats the wire 49 to the point where it begins to emit electrons 40. The ion beam 18 is neutralized so that the substrate 10 does not accumulate charge. If any local region on the substrate 10 charges to an electric potential different than the average ion beam 18 potential, the electrons 40 moving around the ions 46 in the beam 18 are attracted to the higher potential and reduce it back to the average potential of the beam 18.

The ion beam 18 then passes through the mask opening 22 and acquires its shape, with the mask blocking the portion of the beam outside the opening. The shaped ion beam 23 then strikes the metal layer 14 that has been deposited on the substrate 10. The substrate 10 is mounted on a water-cooled translation stage 50 with thermally conductive grease (not shown).

Referring back to FIGS. 4a and 4b, the width of the mask opening 22 at any given position along the opening 22 controls the width of the ion beam. Consequently, the amount of time that any given metal layer section underneath the mask 20 is exposed to the ion beam is controlled by the width of the mask opening 22 and the substrate translation speed.

The overall size of the opening 22 can be changed (without changing the shape or variation in the opening) if one wants to translate the substrate 10 at a different speed. For example, referring back to FIGS. 4 and 5, if one doubles the overall size of the opening 22 in the mask 20 without changing the ratio between the widest 24 and narrowest 26 part of the opening 22, then one can translate the substrate 10 at twice the speed and still achieve the same etch rates at any given part of the metal layer that were achieved with the smaller aperture. Since the shape of the opening 22 is kept the same, the relative difference in etch rates at different parts of the metal layer 14 remain the same.

While several illustrative embodiments of the invention have been shown and described, numerous variations and alternate embodiments will occur to those skilled in the art. For example, alternative ion beam sources may be used and a variety of different aperture masks may be used depending on the type of filter desired. In addition, this concept may be used to fabricate filters or mirrors made with dielectric film or any material that can be etched in the manner described. Such variations and alternate embodiments are contemplated, and can be made without departing from the spirit and scope of the appended claims.

We claim:

1. A system for fabricating precision optical ramp filters, each of said filters having optical transmission and reflectance coefficients that vary as a function of position on said filter, comprising:

a substrate which is optically transparent over a wavelength range of said optical ramp filter, reflective material of a predetermined thickness disposed on said substrate, said reflective material having optical transmission and reflectance coefficients that vary with its thickness, an etching beam generator for generating a shaped etching beam whose width varies along its length, and a translator for imparting a relative translation between said beam and said substrate, with different portions of said reflective material exposed to different respective beam widths so that the thickness of said reflective material after etching varies as a function of position, with a corresponding positional variation in the reflective material's optical transmittance and reflectance.

2. The system of claim 1, wherein said etching beam generator comprises:

an ion beam generator for generating an ion beam and a mask with a shaped aperture for receiving said ion beam, for passing a portion of said ion beam through said shaped aperture and for blocking the portion of said ion beam outside said aperture.

3. The system of claim 2, wherein said width of said aperture varies linearly along its length.

4. The system of claim 2, wherein said width of said aperture varies non-linearly along said length.

5. The system of claim 1, wherein said etching beam generator also generates a uniform etching beam and directs said uniform etching beam to said reflective material so that said reflective material is etched uniformly.

6. A method of fabricating a precision optical ramp filter having optical transmission and reflectance coefficients that vary as a function of position on the filter, comprising the steps of:

forming reflective material having a predetermined thickness on a substrate that is optically transparent over a wavelength range of said optical ramp filter, exposing said reflective material to a shaped etching beam whose width varies as a function of its length, and imparting a relative translation between said beam and substrate so that different portions of said reflective material are ethched by said beam for different periods of time to produce a desired profile in the thickness of said reflective material, with a corresponding variation in its optical transmittance and reflectance.

7. The method of claim 6, further comprising the step of exposing said reflective material to a uniform etching beam whose width is constant as a function of its length so that said reflective material is etched uniformly.

8. The method of claim 6, wherein the step of exposing said reflective material to a shaped etching beam comprises the steps of:

generating an ion beam, and directing said ion beam to a mask with a shaped aperture, a portion of said ion beam passing through said aperture and acquiring the shape of said aperture.

\* \* \* \* \*